United States Patent
Fujii

(10) Patent No.: US 10,951,185 B2
(45) Date of Patent: Mar. 16, 2021

(54) DIFFERENTIAL AMPLIFIER CIRCUIT AND SERIAL TRANSMISSION CIRCUIT

(71) Applicant: TOSHIBA MEMORY CORPORATION, Minato-ku (JP)

(72) Inventor: Shinsuke Fujii, Ota (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 91 days.

(21) Appl. No.: 16/296,628

(22) Filed: Mar. 8, 2019

(65) Prior Publication Data

US 2020/0091882 A1 Mar. 19, 2020

(30) Foreign Application Priority Data

Sep. 13, 2018 (JP) .............................. JP2018-171658

(51) Int. Cl.
H03F 3/45 (2006.01)

(52) U.S. Cl.
CPC ................... *H03F 3/45094* (2013.01); *H03F 2203/45646* (2013.01)

(58) Field of Classification Search
CPC ........................................................ H03F 3/45
See application file for complete search history.

(56) References Cited

U.S. PATENT DOCUMENTS

| | | | | |
|---|---|---|---|---|
| 5,187,448 A | * | 2/1993 | Brooks | H03F 3/45183 330/253 |
| 5,714,911 A | * | 2/1998 | Gilbert | H03B 5/20 331/109 |
| 7,119,612 B1 | * | 10/2006 | Holloway | H03F 1/02 330/9 |
| 7,138,866 B2 | * | 11/2006 | Etoh | H03F 3/45188 330/253 |
| 8,159,300 B2 | | 4/2012 | Masuda | |
| 2008/0273106 A1 | * | 11/2008 | Amini | H04N 5/378 348/301 |
| 2014/0153313 A1 | * | 6/2014 | Boujamaa | G11C 7/14 365/148 |
| 2015/0256138 A1 | * | 9/2015 | Dasgupta | H03F 3/3023 330/255 |

FOREIGN PATENT DOCUMENTS

| | | |
|---|---|---|
| JP | 2009-10640 | 1/2009 |
| JP | 2011-166278 | 8/2011 |
| JP | 2012-60666 | 3/2012 |

\* cited by examiner

*Primary Examiner* — Patricia T Nguyen
(74) *Attorney, Agent, or Firm* — Oblon, McClelland, Maier & Neustadt, L.L.P.

(57) ABSTRACT

A differential amplifier circuit has a first current circuit comprising a first transistor and a second transistor, and to flow a current depending on a voltage of a first input signal, a second current circuit comprising a third transistor and a fourth transistor, and to flow a current depending on a voltage of a second input signal, a fifth transistor comprising a gate connected to a gate and the drain of the second transistor, and to flow a current that is M times greater than the current flowing between the drain and the source of the second transistor, and a sixth transistor comprising a gate connected to a gate and the drain of the fourth transistor and cascode-connected to the first transistor, and to flow a current that is N times greater than the current flowing between the drain and the source of the fourth transistor.

20 Claims, 12 Drawing Sheets

| | OUTPUT COMMON-MODE VOLTAGE | DC Gain | POLE | |
|---|---|---|---|---|
| OUT1P/1N | $(M+1) \cdot I_B \cdot R_{L1}$ | $\dfrac{2g_{m1}g_{m3}}{g_{m1}+2g_{m3}} \cdot R_{L1}$ | $\dfrac{1}{C_{in\,A} \cdot R_{l1}}$ , | $\dfrac{g_{m2}}{C_l}$ |
| OUT2P/2N | $VDD - M \cdot I_B \cdot R_{L2}$ | $\dfrac{2g_{m1}g_{m3}}{g_{m1}+2g_{m3}} \cdot R_{L2}$ | $\dfrac{1}{C_{in\,B} \cdot R_{l2}}$ , | $\dfrac{g_{m2}}{C_l}$ |

When gm1>>gm3, 2gm3

FIG. 3

DIFFERENTIAL AMPLIFIER CIRCUIT AND SERIAL TRANSMISSION CIRCUIT

CROSS REFERENCE TO RELATED APPLICATIONS

This application is based upon and claims the benefit of priority from the prior Japanese Patent Application No. 2018-171658, filed on Sep. 13, 2018, the entire contents of which are incorporated herein by reference.

FIELD

Embodiments described herein relate generally to differential amplifier circuits and serial transmission circuits.

BACKGROUND

During high-speed transmission of signals, serial data is often converted to differential signals for transmission. Serial transmission circuits for this type of transmission include a preamplifier with a level shift circuit that is capable of changing a common-mode voltage level (value) in order to secure an appropriate operating point. The preamplifier may output two sets of differential signals with different common-mode voltages. In such a case, two or more level shift circuits need to be provided in the preamplifier. This increases input capacitance in an input circuit, which in turn lowers the bandwidth. The need of two or more level shift circuits also leads to a problem of an increase in power consumption.

BRIEF DESCRIPTION OF THE DRAWINGS

FIG. 3 is a diagram showing output common-mode voltages, DC gains, and poles of first differential output signals and second differential output signals of the differential amplifier circuit shown in FIG. 1.

DETAILED DESCRIPTION

According to an embodiment, a differential amplifier circuit comprising:

a first circuit comprising a first transistor and a second transistor cascode-connected, and configured to flow a current that depends on a voltage of a first input signal being one of differential input signals, between a drain and a source of the first transistor and between a drain and a source of the second transistor;

a second circuit comprising a third transistor and a fourth transistor cascode-connected, and configured to flow a current that depends on a voltage of a second input signal being another of the differential input signals, between a drain and a source of the third transistor and between a drain and a source of the fourth transistor;

a fifth transistor comprising a gate connected to a gate and the drain of the second transistor and cascode-connected to the third transistor, and configured to flow a current that is M times by current flowing between the drain and the source of the second transistor, between a drain and a source of the fifth transistor, where M is a real number that is greater than 0; and a sixth transistor comprising a gate connected to a gate and the drain of the fourth transistor and cascode-connected to the first transistor, and configured to flow a current that is N times by current flowing between the drain and the source of the fourth transistor, between a drain and a source of the sixth transistor, where N is a real number that is greater than 0, wherein differential output signals are output from at least one of a pair of the drain of the first transistor and the drain of the third transistor and a pair of the drain of the fifth transistor and the drain of the sixth transistor.

Embodiments of the present invention will now be described with reference to the accompanying drawings. In the following descriptions of the embodiments, main configurations and operations of the differential amplifier circuits and the serial transmission circuits will be mainly explained. However, the differential amplifier circuits and the serial transmission circuits may employ other configurations and operations that are not described below.

First Embodiment

Figure 1:
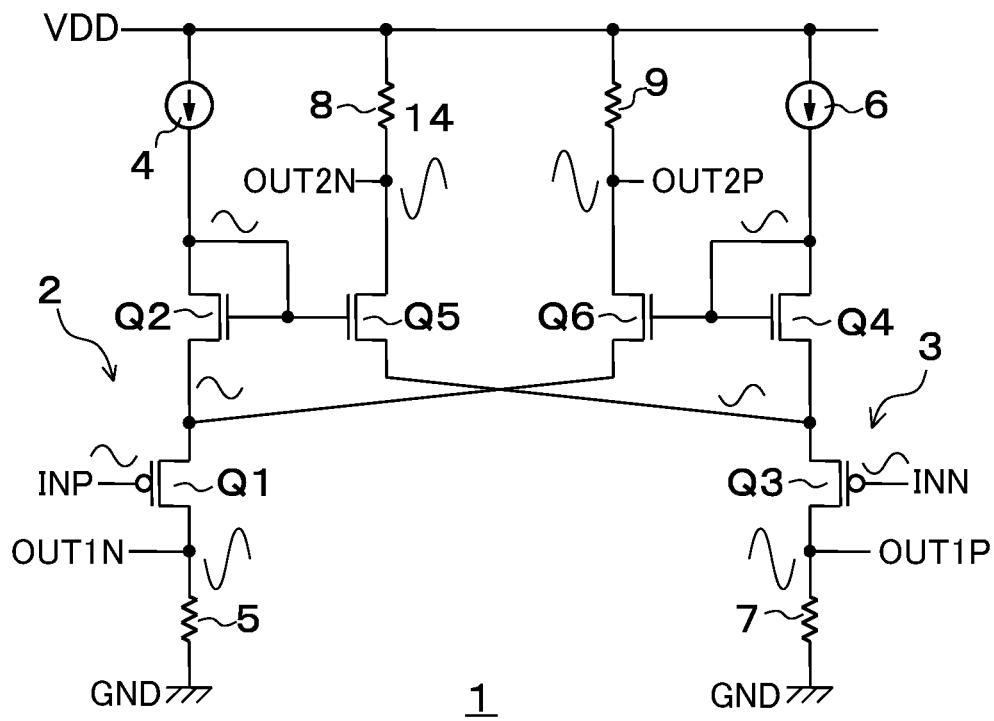
FIG. 1 is a circuit diagram of a differential amplifier circuit according to a first embodiment.

FIG. 1 is a circuit diagram of a differential amplifier circuit 1 according to a first embodiment. The differential amplifier circuit 1 shown in FIG. 1 shifts common-mode voltage level of differential input signals INP and INN to output two sets of differential output signals (OUT1P, OUT1N) and (OUT2P, OUT2N) from two sets of differential output terminals. The differential amplifier circuit 1 shown in FIG. 1 includes a first current circuit 2 with a first transistor Q1 and a second transistor Q2 that are cascode-connected, a second current circuit 3 with a third transistor Q3 and a fourth transistor Q4 that are cascode-connected, a fifth transistor Q5, and a sixth transistor Q6. The first transistor Q1 and the third transistor Q3 are pMOS transistors, and the second transistor Q2, the fourth transistor Q4, the fifth transistor Q5, and the sixth transistor Q6 are nMOS transistors.

In the first current circuit 2, a current that depends on voltage of one of the differential input signals INP and INN, hereinafter called a first input signal INP, flows between a drain and a source of the first transistor Q1 and between a drain and a source of the second transistor Q2. The first input signal INP is input to a gate of the first transistor Q1. A gate and the drain of the second transistor Q2 are connected to each other, and the source of the second transistor Q2 is connected to the source of the first transistor Q1.

In more detail, in the first current circuit 2, current flows from a first reference voltage node VDD to a second reference voltage node GND (ground node). The first current circuit 2 includes a first current source 4 connected between the first reference voltage node VDD and the drain of the second transistor Q2, and a first impedance element 5 connected between the drain of the first transistor Q1 and the ground node GND.

In the second current circuit 3, a current that depends on the voltage of the other of the differential input signals INP and INN, a second input signal INN, flows between the drain and the source of the third transistor Q3 and between the drain and the source of the fourth transistor Q4. The second input signal INN is input to the gate of the third transistor Q3. The gate and the drain of the fourth transistor Q4 are connected to each other, and the source of the fourth transistor Q4 is connected to the source of the third transistor Q3.

In more detail, in the second current circuit 3, the current flows from the first reference voltage node VDD to the second reference voltage node GND (ground node). The second current circuit 3 includes a second current source 6 connected between the first reference voltage node VDD and the drain of the fourth transistor Q4, and a second impedance element 7 connected between the drain of the third transistor Q3 and the ground node GND. The first impedance element 5 and the second impedance element 7 are resistance elements having the same resistance value RL1, for example. For example, the first impedance element 5 and the second impedance element 7 may be formed of series-connected resistance element and inductor element, or other circuit elements.

The gate of the fifth transistor Q5 is connected to the gate of the second transistor Q2. The current flowing between the drain and the source (drain-source current) of the fifth transistor Q5 is M times greater than the current flowing between the drain and the source of the second transistor Q2, where M is a real number greater than 0. Therefore, the area ratio between the second transistor Q2 and the fifth transistor Q5 is 1 to M. A third impedance element 8 is connected between the drain of the fifth transistor Q5 and the first reference voltage node VDD. The source of the fifth transistor Q5 is connected to the source of the third transistor Q3.

The gate of the sixth transistor Q6 is connected to the gate of the fourth transistor Q4. The drain-source current of the sixth transistor Q6 is N times greater than the drain-source current of the fourth transistor Q4, where N is a real number that is greater than 0, and may be equal to or substantially equal to M. Therefore, the area ratio between the fourth transistor Q4 and the sixth transistor Q6 is 1 to M. A fourth impedance element 9 is connected between the drain of the sixth transistor Q6 and the first reference voltage node VDD. The source of the sixth transistor Q6 is connected to the source of the first transistor Q1. The third impedance element 8 and the fourth impedance element 9 are resistance elements having the same resistance value RL2, for example.

The drain of the first transistor Q1 and the drain of the third transistor Q3 are each connected to a first differential output terminal. The first differential output signals OUT1P and OUT1N are output from the first differential output terminals. The drain of the fifth transistor Q5 and the drain of the sixth transistor Q6 are each connected to a second differential output terminal. The second differential output signals OUT2P and OUT2N are output from the second differential output terminals. The voltage of the first differential output signals OUT1P and OUT1N varies in a predetermined voltage variation range from a first common-mode voltage. The voltage of the second differential output signals OUT2P and OUT2N varies in a predetermined voltage variation range from a second common-mode voltage. The second common-mode voltage is higher than the first common-mode voltage. The voltage variation range of the first differential output signals OUT1P and OUT1N and the voltage variation range of the second differential output signals OUT2P and OUT2N are greater than the voltage variation range of the differential input signals INP and INN. The voltage variation range corresponds to the amplitude of the respective signals.

Figure 2:
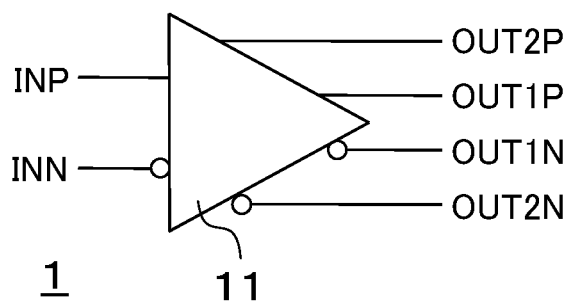
FIG. 2 is a diagram illustrating a symbol of the differential amplifier circuit shown in FIG. 1.

FIG. 2 is a diagram illustrating a symbol of the differential amplifier circuit 1 shown in FIG. 1. As shown in FIG. 2, the differential amplifier circuit 1 shown in FIG. 1, equivalently, is an amplifier 11, which shifts the level of the differential input signals INP and INN with a first common-mode voltage to output the first differential output signals OUT1P and OUT1N, and also shifts the level of the differential input signals INP and INN with a second common-mode voltage to output the second differential output signals OUT2P and OUT2N.

FIG. 3 is a diagram showing output common-mode voltages, DC gains, and poles of the first differential output signals OUT1P and OUT1N and the second differential output signals OUT2P and OUT2N of the differential amplifier circuit 1 shown in FIG. 1. In FIG. 3, the current flowing through the first current source 4 and the second current source 6 is denoted by IB, the transconductance of the first transistor Q1 and the third transistor Q3 is denoted by gm1, the transconductance of the second transistor Q2 and the fourth transistor Q4 is denoted by gm2, the transconductance of the fifth transistor Q5 and the sixth transistor Q6 is denoted by gm3, the input capacitance of the first amplifier 11 is denoted by Cin_A, the input capacitance of the second amplifier 12 is denoted by Cin_B, and the total gate capacitance (earth capacity) of the fifth transistor Q5 and the sixth transistor Q6 is denoted by CL.

When gm1>>gm3, the DC gain is 2gm3·RL1 for the first differential output signals OUT1P and OUT1N, and 2gm3·RL2 for the second differential output signals OUT2P and OUT2N. Therefore, if the first to fourth impedance elements 5, 7, 8, and 9 have the same impedance, the voltage variation range of first differential output signals OUT1P and OUT1N is the same as that of the second differential output signals OUT2P and OUT2N.

As can be understood from FIG. 3, the output common-mode voltage of the first differential output signals OUT1P and OUT1N (first common-mode voltage) is (M+1)·IB·RL1, which is dependent on the value M, the current IB flowing through the first current source 4 and the second current source 6, and the impedance (resistance value) RL1 of the first impedance element 5 and the second impedance element 7. The output common-mode voltage of the second differential output signals OUT2P and OUT2N (second common-mode voltage) is VDD−M·IB·RL2, which is dependent on the value M, the current IB flowing through the first current source 4 and the second current source 6, and the impedance (resistance value) RL2 of the third impedance element 8 and the fourth impedance element 9.

The poles shown in FIG. 3 indicate frequencies at which DC gain start decreasing by 3 dB. As the values of the poles become higher, the bandwidth broadens, which means that the electric characteristic is improved. In order to increase the values of the poles, the input capacitances Cin_A and Cin_B of the first amplifier 11 and the second amplifier 12 are decreased, or the impedances RL1 and RL2 of the first to fourth impedance elements 5, 7, 8, and 9 are decreased, or the total gate capacitance CL of the fifth and sixth transistors Q5 and Q6 is decreased, or the transconductance gm2 of the second and fourth transistors Q2 and Q4 is decreased. In order to reduce the power consumption, the drain-source currents of the second and fourth transistors Q2 and Q4 may be decreased. However, this would narrow the bandwidth.

Referring again to FIG. 1, the operation of the differential amplifier circuit 1 is described. The source voltage of the first transistor Q1 and the source voltage of the second transistor Q2 vary depending on the voltage amplitude of one of the differential input signals INP and INN, which is the differential input signal INP. Since the gate and the drain of the second transistor Q2 are connected to each other, the drain voltage of the second transistor Q2 varies depending on the change in the source voltage of the second transistor Q2.

The source voltage of the fifth transistor Q5, the gate of which is shared by the second transistor Q2, varies in the direction opposite to the source voltage of the second transistor Q2. Therefore, the voltage between the gate and the source (gate-source voltage) of the fifth transistor Q5 is higher than the gate-source voltage of the second transistor Q2, and the variation range of the drain voltage of the fifth transistor Q5 is greater than the variation range of the source voltage of the first transistor Q1. Similarly, the variation range of the drain voltage of the sixth transistor Q6 is greater than the variation range of the source voltage of the third transistor Q3.

The direction along which the gate voltage of the third transistor Q3 changes is the same as the direction along which the source voltages of the fifth transistor Q5 and the third transistor Q3 change. Therefore, as the gate voltage of the third transistor Q3 decreases, the source voltage of the fifth transistor Q5 decreases. However, when the gate voltage of the third transistor Q3 decreases, the gate voltage of the first transistor Q1 increases, and therefore the drain voltage and the gate voltage of the second transistor Q2 increases, and the gate voltage of the fifth transistor Q5 also increases. This leads to an increase in the gate-source voltage of the fifth transistor Q5 and an increase in the drain current of the fifth transistor Q5, resulting in an increase in the drain current of the third transistor Q3. Therefore, the variation range of the drain voltage of the third transistor Q3 becomes greater than the variation range of the drain voltage of the second transistor Q2. The variation range of the drain voltage of the first transistor Q1 is about the same as the variation range of the drain voltage of the third transistor Q3, and therefore is greater than the variation ranges of the drain voltage of the second transistor Q2 and the drain voltage of the fourth transistor Q4.

As described above, the differential amplifier circuit 1 shown in FIG. 1 includes the third to sixth transistors Q3 to Q6 in addition to the first transistor Q1 and the second transistor Q2, to the gates of which the differential input signals INP and INN are input, to generate the first differential output signals OUT1P and OUT1N with the first common-mode voltage and the second differential output signals OUT2P and OUT2N with the second common-mode voltage.

Since the drain-source current may be reduced in the second transistor Q2 and the fourth transistor Q4, the differential amplifier circuit 1 shown in FIG. 1 may operate with a low power consumption. Furthermore, since the gate-source voltage is increased in the fifth transistor Q5 and the sixth transistor Q6, the drain-source current of the fifth transistor Q5 and the sixth transistor Q6 may be increased, which leads to a higher gain.

Although the differential amplifier circuit 1 shown in FIG. 1 generates two sets of differential output signals, the first and second differential output signals (OUT1P, OUT1N) and (OUT2P, OUT2N), it may generate only one of the two sets of differential output signals, (OUT1P, OUT1N) or (OUT2P, OUT2N). For example, if only the first differential output signals OUT1P and OUT1N are to be generated, the third impedance element 8 and the fourth impedance element 9 may be removed, and the drain of the fifth transistor Q5 and the drain of the sixth transistor Q6 may be connected to the first reference voltage node VDD. If only the second differential output signals OUT2P and OUT2N are to be generated, the first impedance element 5 and the second impedance element 7 may be removed, and the drain of the first transistor Q1 and the drain of the third transistor Q3 may be connected to the second reference voltage node GND (ground node).

As described above, the differential amplifier circuit 1 according to the first embodiment includes the fifth transistor Q5, the gate of which is shared by the second transistor Q2 that is cascode-connected to the first transistor Q1, and the sixth transistor Q6, the gate of which is shared by the fourth transistor Q4 that is cascode-connected to the third transistor Q3, the source of the fifth transistor Q5 being connected to the source of the third transistor Q3 and the source of the sixth transistor Q6 being connected to the source of the first transistor Q1. As a result, the drain voltages of the first transistor Q1 and the third transistor Q3 and the drain voltages of the fifth transistor Q5 and the sixth transistor Q6 may be changed in a voltage variation range that is broader than the voltage variation range of the differential input signals INP and INN input to the gates of the first transistor Q1 and the third transistor Q3. This leads to a high gain. Since the drain-source currents of the second transistor Q2 and the fourth transistor Q4 are reduced, the differential amplifier circuit 1 according to the first embodiment can operate with a low power consumption.

Second Embodiment

The differential amplifier circuit 1 according to the first embodiment is capable of decreasing the drain-source current of each of the second transistor Q2 and the fourth transistor Q4. However, decreasing the drain-source currents of these transistors leads to narrowing the bandwidth. A differential amplifier circuit 1a according to a second embodiment is therefore intended to have a broader bandwidth.

Figure 4:
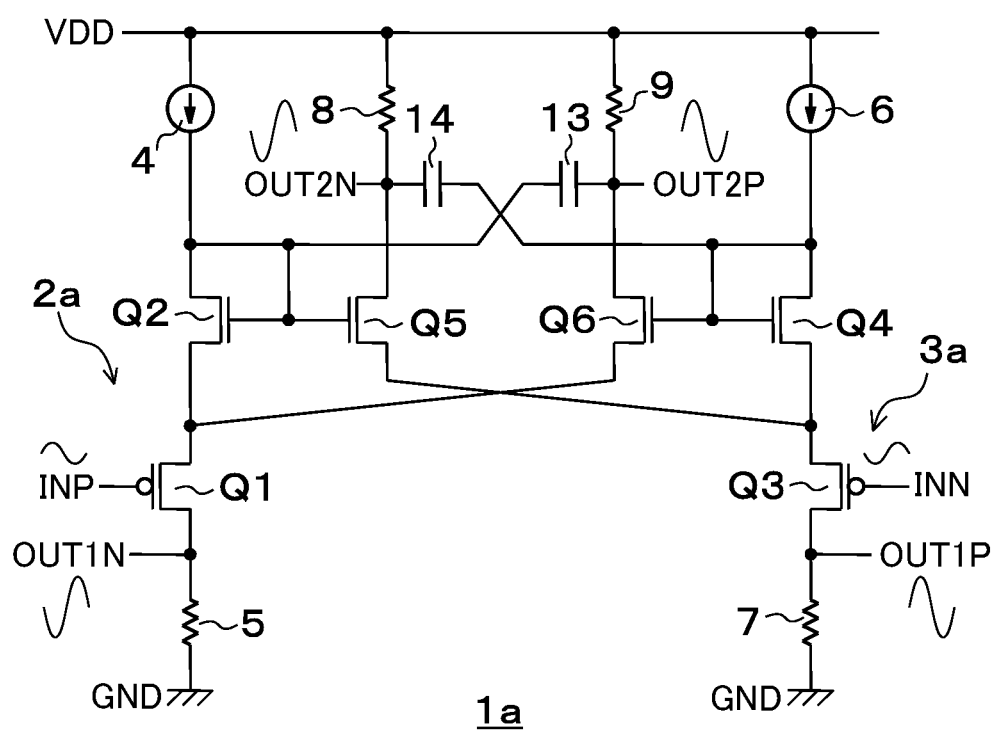
FIG. 4 is a circuit diagram of a differential amplifier circuit according to a second embodiment.

FIG. 4 is a circuit diagram of the differential amplifier circuit 1a according to the second embodiment. In FIG. 4, the circuit elements that are common to those in FIG. 1 have the same reference numerals. In the descriptions below, the differences between the first embodiment and the second embodiment will be mainly described. The differential amplifier circuit 1a shown in FIG. 4 includes a first capacitor 13 and a second capacitor 14 added to the circuit configuration of the differential amplifier circuit 1 shown in FIG. 1. The first capacitor 13 is connected between the drain of the second transistor Q2 and the drain of the sixth transistor Q6. The second capacitor 14 is connected between the drain of the fourth transistor Q4 and the drain of the fifth transistor Q5.

The addition of the first capacitor 13 and the second capacitor 14 enables the positive feedback of the second differential output signals OUT2P and OUT2N to the gates of the second transistor Q2 and the fourth transistor Q4. More specifically, as the drain voltage of the second transistor Q2, the drain voltage of the fourth transistor Q4, the source voltage of the fifth transistor Q5 and the source voltage of the sixth transistor Q6 change due to the change in the differential input signals INP and INN input to the gates of the first transistor Q1 and the third transistor Q3, the drain current of the fifth transistor Q5 and the drain current of the sixth transistor Q6 change, which in turn changes the second differential output signals OUT2P and OUT2N.

If the frequency of the signals become higher, the second differential output signals OUT2P and OUT2N change the gate voltages of the fifth transistor Q5 and the sixth transistor Q6 via the first capacitor 13 and the second capacitor 14, to change the drain current of the fifth transistor Q5 and the drain current of the sixth transistor Q6 more greatly. The change in the drain current of the fifth transistor Q5 and the drain current of the sixth transistor Q6 changes the first differential output signals OUT1P and OUT1N via the first transistor Q1 and the third transistor Q3. As a result, the bandwidth is broadened.

By adding the first capacitor 13 and the second capacitor 14, a zero point is created in the frequency characteristics of the differential amplifier circuit 1a. The zero point is a frequency at which the gain in the low frequency band increases by 3 dB if the frequency characteristics show that the low frequency band is flat. The creation of the zero point broadens the bandwidth.

For example, if the capacitance of the first capacitor 13 and the second capacitor 14 is Cp, and the capacitance other than that of the first capacitor 13 and the second capacitor 14 is ignored, the zero point $\omega z$ and the pole $\omega p$ can be expressed by the following equations (1) and (2).

$$\omega_z = \frac{g_{m2} g_{m3}}{c_p (g_{m1} + g_{m2} + g_{m2} g_{m3} R_{L2})} \quad (1)$$

$$\omega_p = \frac{g_{m2}(g_{m1} + g_{m3})}{c_p (g_{m1} + g_{m2} + g_{m3} + (g_{m1} g_{m2} + g_{m1} g_{m3} + g_{m2} g_{m3}) R_{L2})} \quad (2)$$

Figure 5:
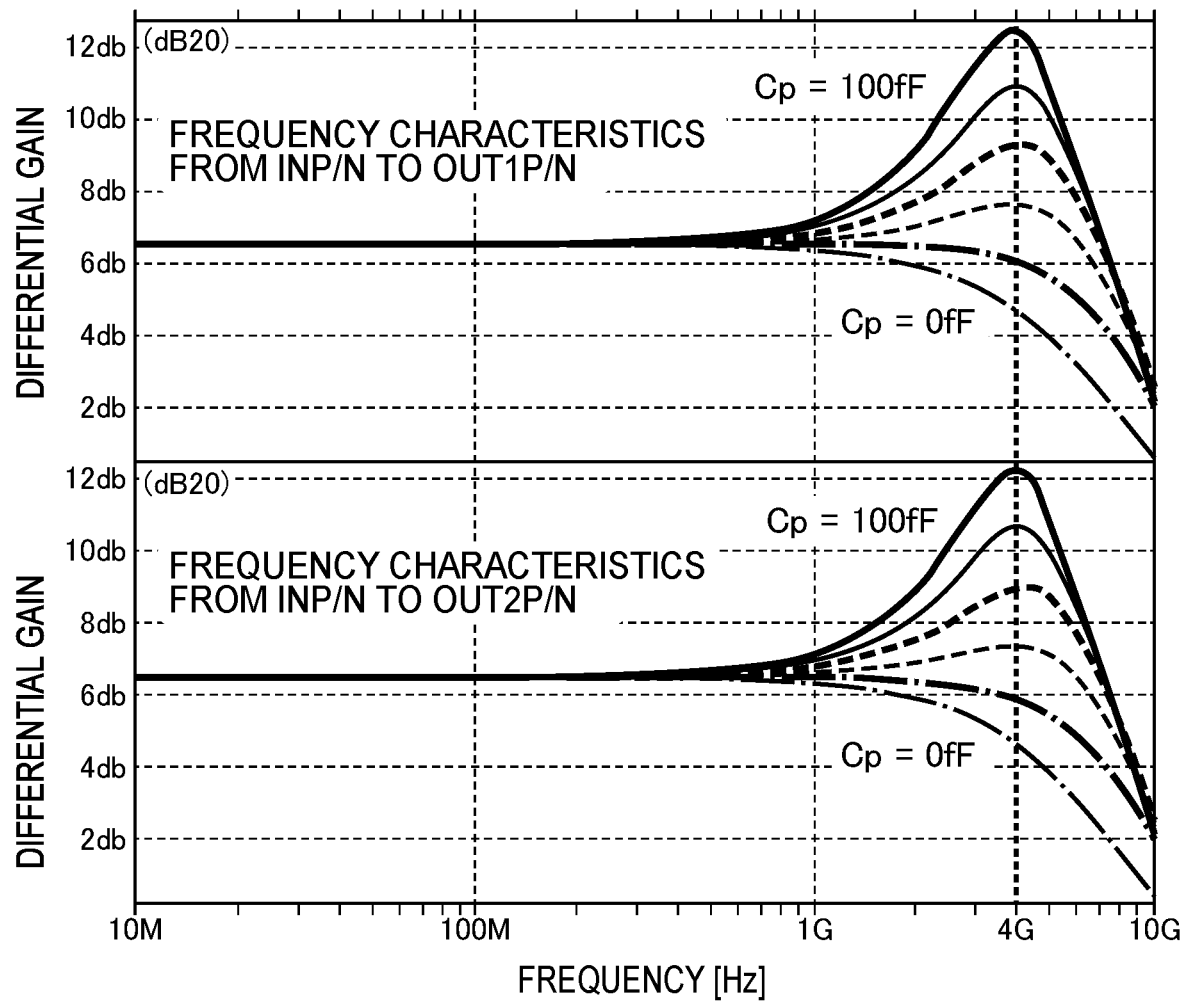
FIG. 5 is a diagram showing frequency characteristics of differential gain from the differential input signals to the first differential output signals, and frequency characteristics of differential gain from the differential input signals to the second differential output signals in the differential amplifier circuit shown in FIG. 4.
Figure 6:
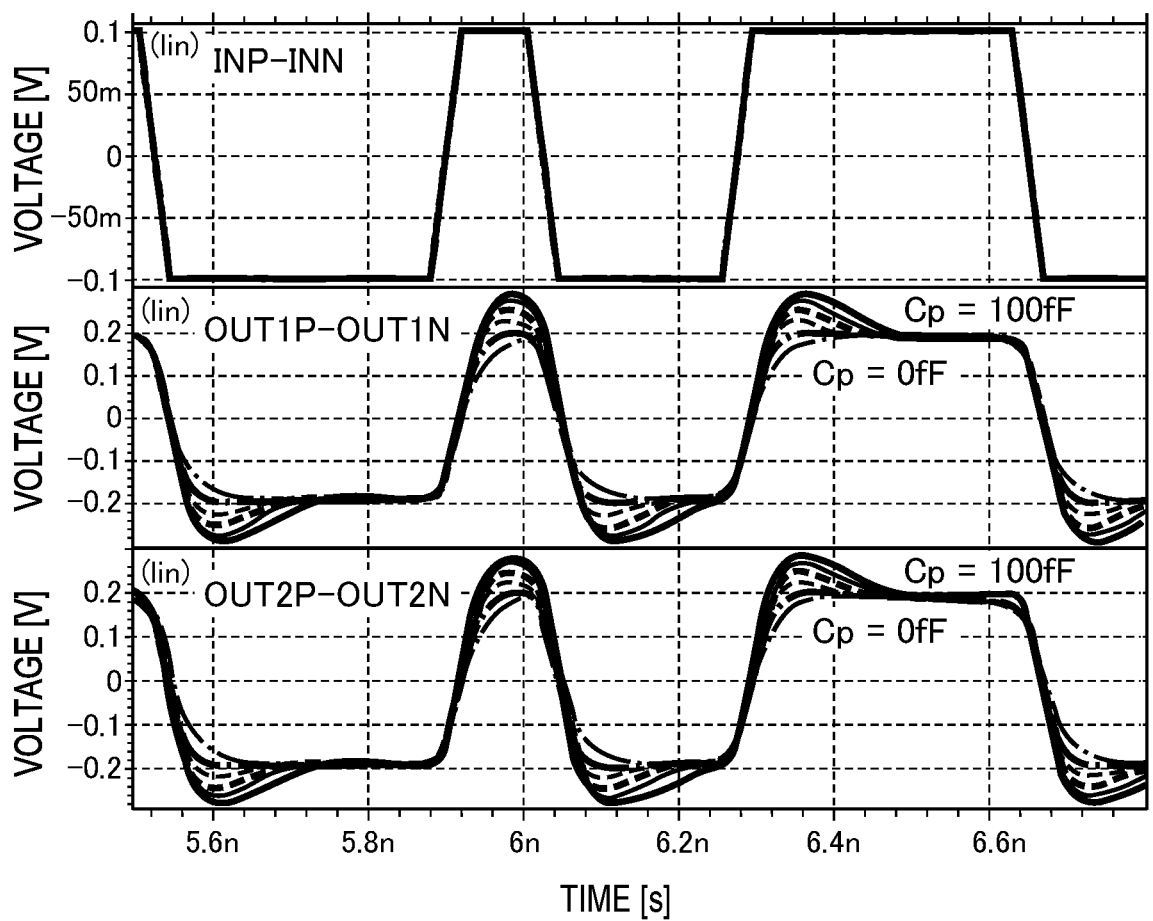
FIG. 6 illustrates voltage waveforms of the differential input signals, the first differential output signals, and the second differential output signals.

FIG. 5 is a diagram showing frequency characteristics of differential gain from the differential input signals INP and INN to the first differential output signals OUT1P and OUT1N, and frequency characteristics of differential gain from the differential input signals INP and INN to the second differential output signals OUT2P and OUT2N in the differential amplifier circuit 1a shown in FIG. 4. The differential gain here means the amplification ratio of the differential output signals to the differential input signals. In FIG. 5, the horizontal axis represents the frequency [Hz], and the vertical axis represents the differential gain. FIG. 6 illustrates voltage waveforms of the differential input signals INP and INN, the first differential output signals OUT1P and OUT1N, and the second differential output signals OUT2P and OUT2N. FIGS. 5 and 6 show the frequency characteristics of the differential gain and the voltage waveforms when the capacitance of the first capacitor 13 and the second capacitor 14 is changed from 0 to 100 fF in steps of 20 fF.

FIG. 5 shows the frequency characteristics of the differential amplifier circuit 1a designed to pass signals at the frequency of up to 4 GHz. As shown in FIG. 5, as the capacitance of the first capacitor 13 and the second capacitor 14 increases, the differential gain at the frequency of 4 GHz increases. A pole exists at the frequency of 4 GHz where the DC gain decreases by 3 dB if the first capacitor 13 and the second capacitor 14 have no capacitance. As shown in FIG. 6, as the capacitance of the first capacitor 13 and the second capacitor 14 increases, overshoots and undershoots at the rising edges and the falling edges of signals increase.

Although it seems that the frequency characteristics of the first differential output signals OUT1P and OUT1N are similar to those of the second differential output signals OUT2P and OUT2N in FIG. 5, they are different since the signal paths are different.

As can be understood from FIGS. 5 and 6, the differential gain and the voltage waveforms of the first differential output signals OUT1P and OUT1N and the second differential output signals OUT2P and OUT2N change as a function of the capacitance of the first capacitor 13 and the second capacitor 14. However, the optimum value and the optimum shape of the differential gain and the optimum voltage waveform rely on the bandwidth of a circuit positioned before the differential amplifier circuit 1a, and therefore cannot be easily determined.

Figure 7:
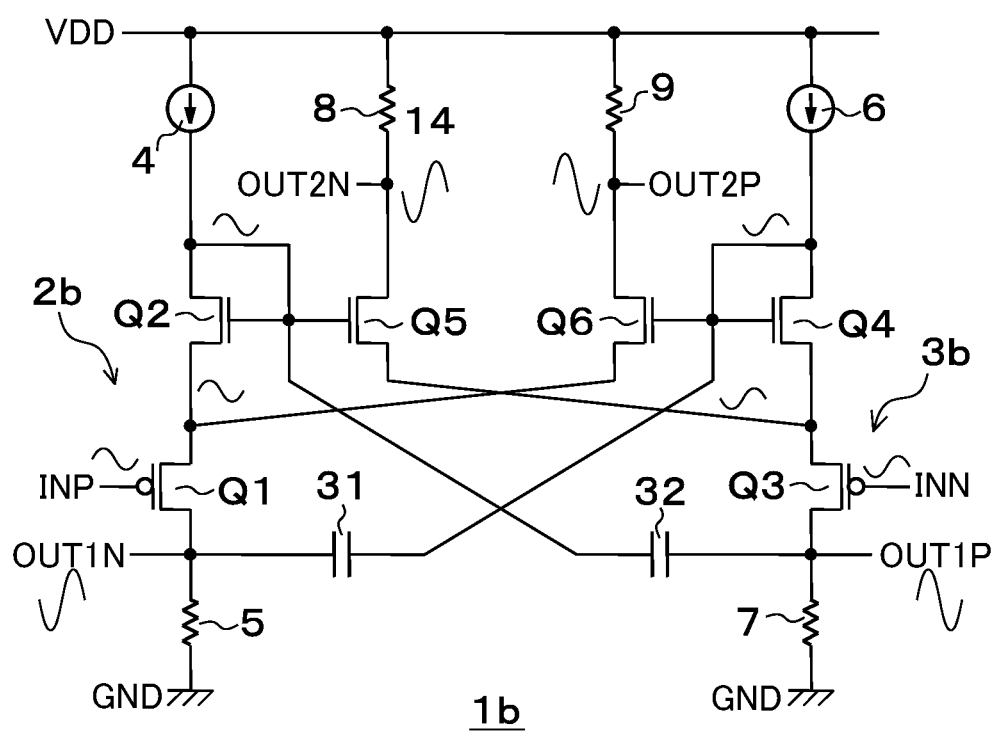
FIG. 7 is a circuit diagram of a differential amplifier circuit according to a modification of the second embodiment.

FIG. 7 is a circuit diagram of a differential amplifier circuit 1b according to a modification of the second embodiment. The differential amplifier circuit 1b shown in FIG. 7 includes a third capacitor 31 and a fourth capacitor 32 instead of the first capacitor 13 and the second capacitor 14 of the differential amplifier circuit 1a shown in FIG. 4. The third capacitor 31 shown in FIG. 7 is connected between the drain of the first transistor Q1 and the drain and the gate of the fourth transistor Q4. The fourth capacitor 32 is connected between a node connecting to the drain of the third transistor Q3 and a node connecting to the drain and the gate of the second transistor Q2. In the differential amplifier circuit 1b shown in FIG. 7, the positive feedback of the first differential output signals OUT1P and OUT1N is provided to the gates of the second transistor Q2 and the fourth transistor Q4 via the third capacitor 31 and the fourth capacitor 32. Like the first capacitor 13 and the second capacitor 14 shown in FIG. 4, the third capacitor 31 and the fourth capacitor 32 create a zero point in the frequency characteristics of the differential amplifier circuit 1b. This leads to broadening of the bandwidth.

Figure 8:
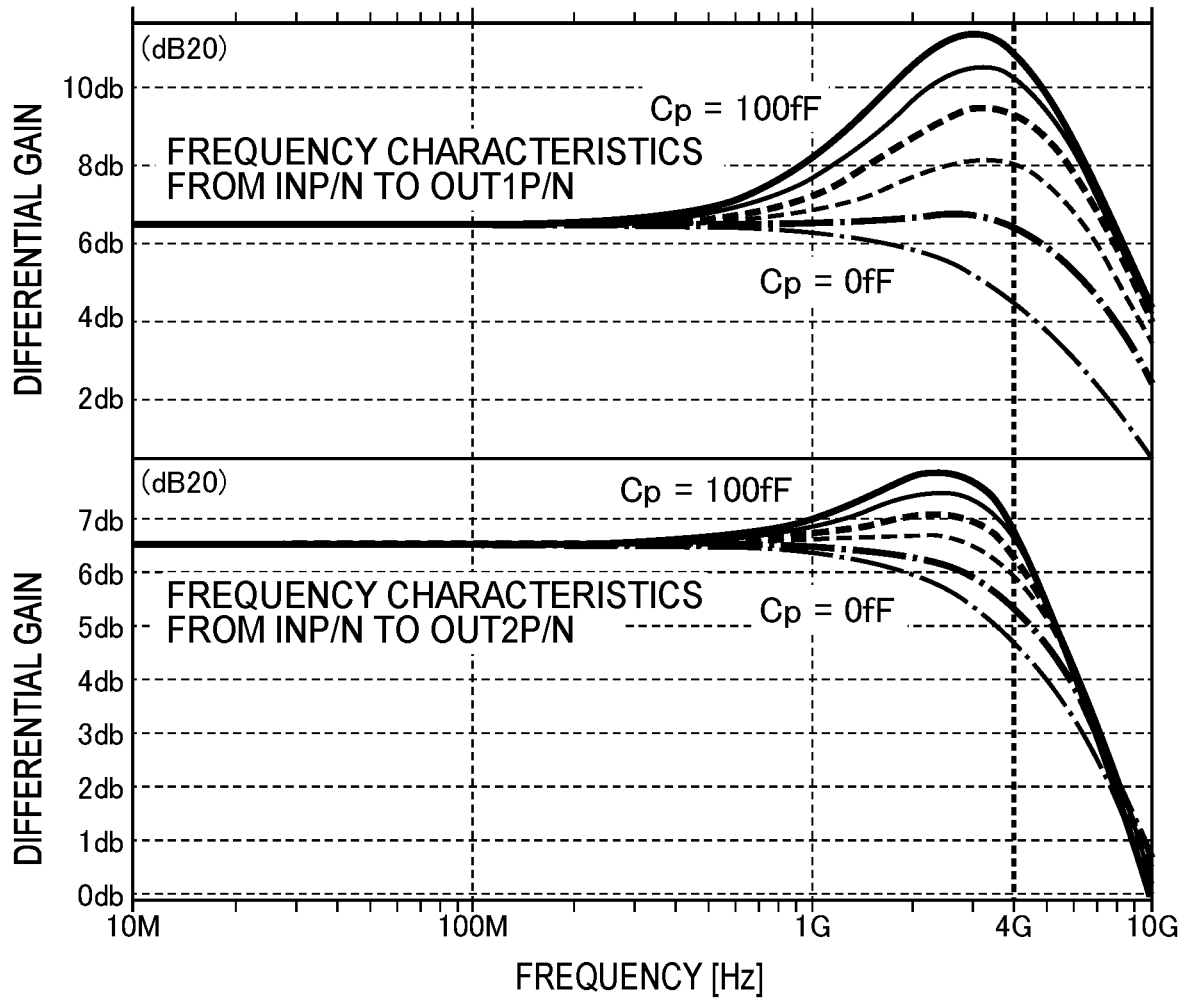
FIG. 8 is a diagram showing frequency characteristics of differential gain from the differential input signals to the first differential output signals and frequency characteristics of differential gain from the differential input signals to the second differential output signals in the differential amplifier circuit shown in FIG. 7.

FIG. 8 is a diagram showing frequency characteristics of differential gain from the differential input signals INP and INN to the first differential output signals OUT1P and OUT1N and frequency characteristics of differential gain from the differential input signals INP and INN to the second differential output signals OUT2P and OUT2N in the differential amplifier circuit 1b shown in FIG. 7. As can be understood from the comparison between FIG. 8 and FIG. 5, the addition of the third capacitor 31 and the fourth capacitor 32 provides a zero point around 4 GHz. Therefore, the differential gain may increase around 4 GHz.

The frequency characteristics of the first differential output signals OUT1P and OUT1N and those of the second differential output signals OUT2P and OUT2N in FIG. 8 differ from each other since the signal paths are different.

In the differential amplifier circuits 1a and 1b shown in FIGS. 4 and 7, two sets of output signals, the first differential output signals OUT1P and OUT1N and the second differential output signals OUT2P and OUT2N, are produced. However, only one of the two sets of the differential output signals, (OUT1P, OUT1N) or (OUT2P, OUT2N), may be produced.

All of the first capacitor 13 and the second capacitor 14 shown in FIG. 4 and the third capacitor 31 and the fourth capacitor 32 shown in FIG. 7 may be employed as a modification of the differential amplifier circuits 1a and 1b shown in FIGS. 4 and 7.

As described above, the first capacitor 13 and the second capacitor 14 (or/and the third capacitor 31 and the fourth capacitor 32) are additionally included in the differential amplifier circuits 1a and 1b according to the second embodiment. This enables a positive feedback of the first differential output signals OUT1P and OUT1N or the second differential output signals OUT2P and OUT2N to the gates of the second transistor Q2 and the fourth transistor Q4 via the first capacitor 13 and the second capacitor 14 (or/and the third capacitor 31 and the fourth capacitor 32). As a result, a zero point may be created in the frequency characteristics of the differential amplifier circuits 1a and 1b, and the bandwidth can be broadened.

Third Embodiment

The differential amplifier circuits 1, 1a, and 1b according to the first and second embodiments output two sets of differential output signals (OUT1P, OUT1N) and (OUT2P, OUT2N) (the first differential output signals OUT1P and OUT1N and the second differential output signals OUT2P and OUT2N) with different output common-mode voltages. However, only one set of differential output signals, (OUT1P, OUT1N) or (OUT2P, OUT2N), may be output from a plurality of differential output terminals.

Figure 9:
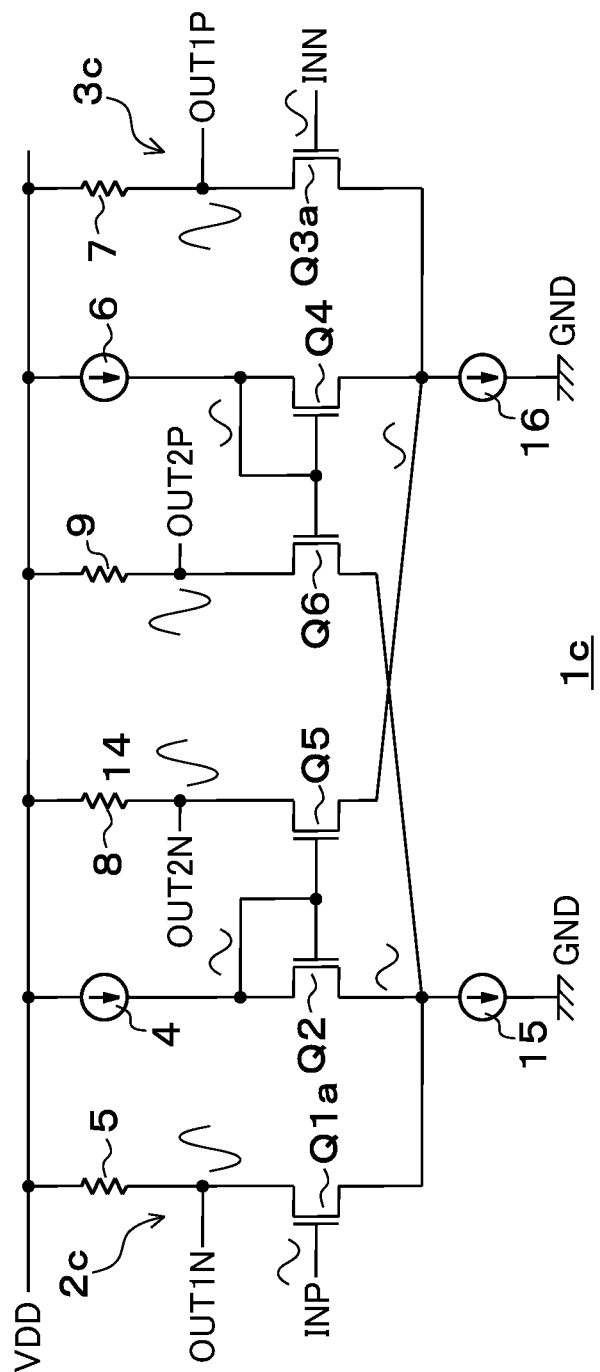
FIG. 9 is a circuit diagram of a differential amplifier circuit according to a third embodiment.

FIG. 9 is a circuit diagram of a differential amplifier circuit 1c according to a third embodiment. The circuit components of the differential amplifier circuit 1c shown in FIG. 9, which have the same functions as those in FIG. 1 have the same reference numerals. In the descriptions below, the differences between the first embodiment and the third embodiment will be mainly described.

The differential amplifier circuit 1c shown in FIG. 9 includes a first current circuit 2c with a first transistor Q1a, a second transistor Q2, a second current circuit 3c with a third transistor Q3a, a fourth transistor Q4, a fifth transistor Q5, and a sixth transistor Q6. The conductivity type of the first transistor Q1a and the third transistor Q3a is opposite to that of the first transistor Q1 and the third transistor Q3 included in the above-described differential amplifier circuits 1, 1a, and 1b. Thus, they are nMOS transistors.

Differential input signals INP and INN are input to the gates of the first transistor Q1a and the third transistor Q3a. In the first current circuit 2c, a current that depends on the differential input signal INP flows between the drain and the source of the first transistor Q1a. In more detail, the first current circuit 2c includes a first impedance element 5, the first transistor Q1a, and a third current source 15 that are connected in series between a power supply voltage node and a ground node. In the second transistor Q2, a drain-source current flows, which correlates with a drain-source current of the first transistor Q1a. In the second current circuit 3c, a current that depends on the differential input signal INN flows between the drain and the source of the third transistor Q3a. In more detail, the second current circuit 3c includes a second impedance element 7, the third transistor Q3a, and a fourth current source 16 that are connected in series between the power supply voltage node and the ground node. In the fourth transistor Q4, a drain-source current flows, which correlates with a drain-source current of the third transistor Q3a.

The circuit configuration of the differential amplifier circuit 1c shown in FIG. 9 is obtained by folding the circuit shown in FIG. 1 so that the first transistor Q1 and the first impedance element 5 that are connected in series and the third transistor Q3 and the second impedance element 7 that are connected in series are on the first reference voltage node VDD side.

In the third current source 15, a current obtained by combining the drain-source current of the first transistor Q1a, the drain-source current of the second transistor Q2, and the drain-source current of the sixth transistor Q6 flows. The drain-source current of the fifth transistor Q5 can be expressed as M·IBP and the drain-source current of the first transistor Q1a can be expressed as IBN−(M+1)IBP since the drain-source current of the sixth transistor Q6 is substantially the same as the drain-source current of the fifth transistor Q5, where IBN is the current flowing through the third current source 15, and IBP is the drain-source current of the second transistor Q2.

Similarly, a current obtained by combining the drain-source current of the third transistor Q3a, the drain-source current of the fourth transistor Q4, and the drain-source current of the fifth transistor Q5 flows through the fourth current source 16.

Like the differential amplifier circuit 1 shown in FIG. 1, the differential amplifier circuit 1c shown in FIG. 9 outputs first differential output signals OUT1P and OUT1N from the drains of the first transistor Q1a and the third transistor Q3a, and second differential output signals OUT2P and OUT2N from the drains of the fifth transistor Q5 and the sixth transistor Q6. The output common-mode voltage of the first differential output signals OUT1P and OUT1N is about the same as the output common-mode voltage of the second differential output signals OUT2P and OUT2N. In the differential amplifier circuit 1 shown in FIG. 1, the voltage of the first differential output signals OUT1P and OUT1N varies in a predetermined voltage variation range based on the first common-mode voltage that is close to the second reference voltage node GND, and the voltage of the second differential output signals OUT2P and OUT2N varies in a predetermined voltage variation range based on a second common-mode voltage that is close to the first reference voltage node VDD. However, in the differential amplifier circuit 1c shown in FIG. 9, the voltage of both of the first differential output signals OUT1P and OUT1N and the second differential output signals OUT2P and OUT2N varies in a predetermined voltage variation range based on an output common-mode voltage that is close to the first reference voltage node VDD. Therefore, the level of the first reference voltage node VDD in the differential amplifier circuit 1c shown in FIG. 9 may be lower than that of the differential amplifier circuit 1 shown in FIG. 1. The differential amplifier circuit 1c is thus suitable for the use with a low power supply voltage.

Figure 10:
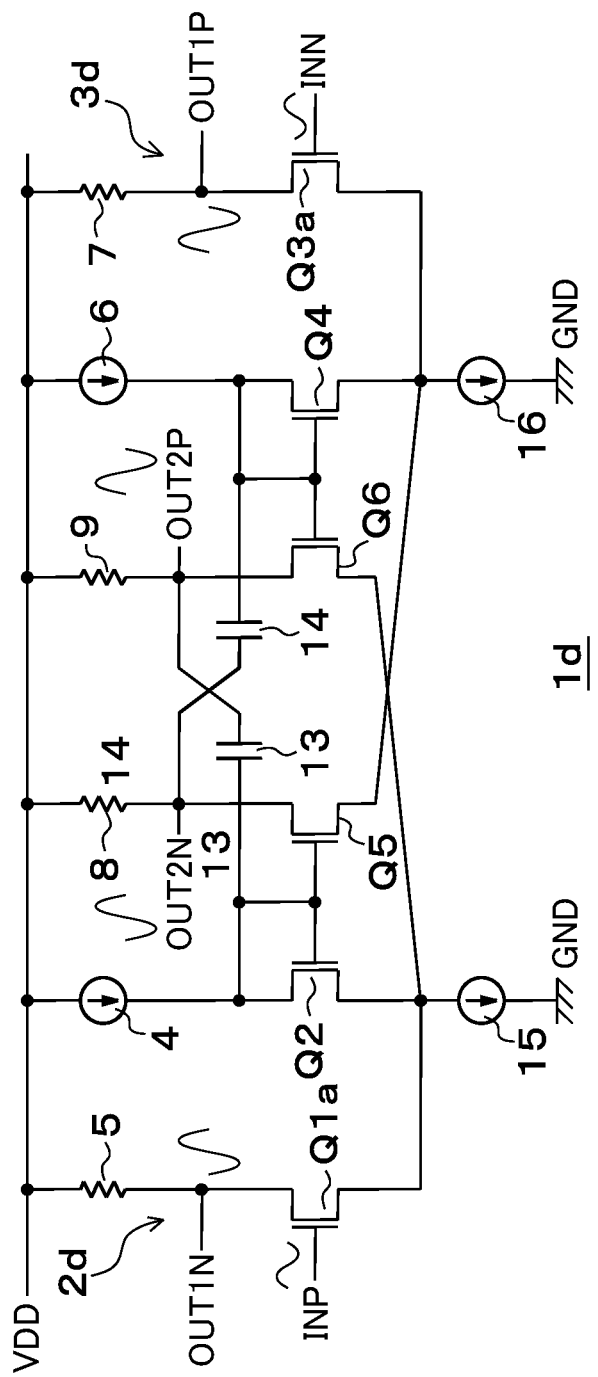
FIG. 10 is a circuit diagram obtained by adding a first capacitor and a second capacitor to the differential amplifier circuit show in FIG. 9.

FIG. 10 shows a differential amplifier circuit 1d with a circuit diagram that is obtained by adding a first capacitor 13 and a second capacitor 14 to the differential amplifier circuit 1c shown in FIG. 9. The first capacitor 13 is connected between the drain of the second transistor Q2 and the drain of the sixth transistor Q6. The second capacitor 14 is connected between the drain of the fourth transistor Q4 and the drain of the fifth transistor Q5.

The addition of the first capacitor 13 and the second capacitor 14 enables the differential amplifier circuit 1d to have a zero point in the frequency characteristics, as in the second embodiment. This leads to broadening of the bandwidth. Instead of the first capacitor 13 and the second capacitor 14, or together with the first capacitor 13 and the second capacitor 14, a third capacitor 31 and a fourth capacitor 32 may be added to the differential amplifier circuit 1c shown in FIG. 9, like the differential amplifier circuit 1b shown in FIG. 7. In this case, the third capacitor 31 is connected between the source of the first transistor Q1a and the gate of the fourth transistor Q4, and the fourth capacitor 32 is connected between the source of the third transistor Q3a and the gate of the second transistor Q2.

The differential amplifier circuits 1c and 1d shown in FIGS. 9 and 10 generate two sets of differential output signals, the first differential output signals OUT1P and OUT1N and the second differential output signals OUT2P and OUT2N, with about the same output common-mode voltage. Such a differential amplifier circuit is effective when a plurality of circuits that need to use an output common-mode voltage with the same voltage level are present after the differential amplifier circuit 1c or 1d. If there is only one circuit after the differential amplifier circuit, only one of the set of the first differential output signals OUT1P and OUT1N and the set of the second differential output signals OUT2P and OUT2N, which are generated in the differential amplifier circuits 1c and 1d shown in FIGS. 9 and 10, may be generated. If, for example, only the first differential output signals OUT1P and OUT1N are generated, the third impedance element 8 and the fourth impedance element 9 for generating the second differential output signals OUT2P and OUT2N may be removed.

As described above, in the third embodiment, a plurality of sets of differential output signals (OUT1P, OUT1N) and (OUT2P, OUT2N) with substantially the same output common-mode voltage can be generated by folding the first transistor Q1 and the first impedance element 5 that are connected in series in FIG. 1 and the third transistor Q3 and the second impedance element 7 that are connected in series in FIG. 1 on the first reference voltage node VDD side.

Fourth Embodiment

A differential amplifier circuit according to a fourth embodiment has a common mode feedback (CMFB) function. Shortening the gate length of the second and fourth to sixth transistors Q2 and Q4 to Q6 in the differential amplifier circuit 1 shown in FIG. 1 would work effectively to secure the frequency band. However, if the gate lengths of these transistors are shortened, the drain-source current of the fifth transistor Q5 and the sixth transistor Q6 may be shifted from the value determined by the mirror ratio 1:M due to the channel length modulation effect. A differential amplifier according to a fifth embodiment is intended to avoid this shift.

Figure 11:
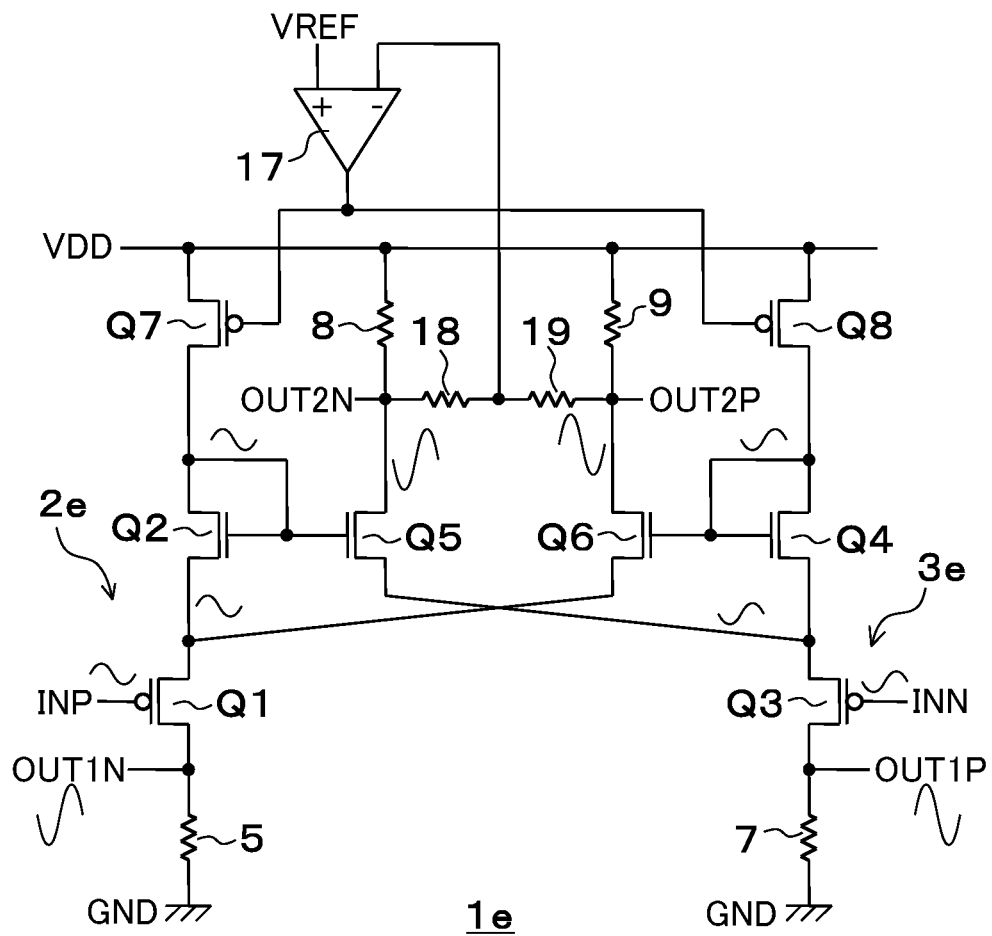
FIG. 11 is a circuit diagram of a differential amplifier circuit according to a fourth embodiment.

FIG. 11 is a circuit diagram of the differential amplifier circuit 1e according to the fourth embodiment. The circuit components of the differential amplifier shown in FIG. 11, which are common to those in FIG. 1, have the same reference numerals. In the descriptions below, the differences between the first embodiment and the fourth embodiment will be mainly described. The differential amplifier circuit 1e shown in FIG. 11 is obtained by adding a comparator (potential difference detection circuit) 17, a fifth impedance element 18, and a sixth impedance element 19 to the differential amplifier circuit 1 shown in FIG. 1. Furthermore, in the differential amplifier circuit 1e shown in FIG. 11, the first current source 4 is replaced by a seventh transistor Q7, which is a pMOS transistor, and the second current source 6 is replaced by an eighth transistor Q8, which is a pMOS transistor. The source of the seventh transistor Q7 is connected to the first reference voltage node VDD, and the drain of the seventh transistor Q7 is connected to the gate and the drain of the second transistor Q2 and the gate of the fifth transistor Q5. The source of the eighth transistor Q8 is connected to the first reference voltage node VDD, and the drain of the eighth transistor Q8 is connected to the gate and the drain of the fourth transistor Q4 and the gate of the sixth transistor Q6.

A fifth impedance element 18 and a sixth impedance element 19 are connected in series between the drain of the fifth transistor Q5 and the drain of the sixth transistor Q6. A voltage at a connection node connecting the fifth impedance element 18 and the sixth impedance element 19 is input to the comparator 17 to be compared with a predetermined reference voltage. The comparator 17 outputs a voltage signal that is associated with a differential voltage between the voltage at the connection node connecting the fifth impedance element 18 and the sixth impedance element 19 and the reference voltage. The voltage signal output from the comparator 17 is input to the gates of the seventh transistor Q7 and the eighth transistor Q8. The gate voltage at the gates of the seventh transistor Q7 and the eighth transistor Q8 can be controlled by the CMFB in this manner. Controlling the gate voltage of the seventh transistor Q7 and the eighth transistor Q8 leads to controlling the gate voltage of the fifth transistor Q5 and the sixth transistor Q6, which results in the compensation for the channel length modulation effect of the fifth transistor Q5 and the sixth transistor Q6.

Although the differential amplifier circuit 1e shown in FIG. 11 generates two sets of differential output signals (OUT1P, OUT1N) and (OUT2P, OUT2N), it may generate only one of the two sets of differential output signals (OUT1P, OUT1N) or (OUT2P, OUT2N). For example, if only the differential output signals OUT1P and OUT1N are generated, the third impedance element 8 and the fourth impedance element 9 for generating the other differential output signals OUT2P and OUT2N may be removed. Furthermore, a port for outputting the output signal from the comparator 17 may be provided instead of generating the differential output signals OUT2P and OUT2N. A comparator 17, a fifth impedance element 18, and a sixth impedance element 19, which are similar to those shown in FIG. 11, may be provided to the differential amplifier circuit 1 of FIG. 4, 7, or 9. In such a case, only one set of differential output signals (OUT1P, OUT1N) or (OUT2P, OUT2N) may be generated.

As described above, the comparator 17, the fifth impedance element 18, and the sixth impedance element 19 are included in the differential amplifier circuit 1e according to the fourth embodiment to achieve a CMFB function to control the drain voltage of the fifth transistor Q5 and the sixth transistor Q6. As a result, the channel modulation effect of the fifth transistor Q5 and the sixth transistor Q6 may be compensated.

Fifth Embodiment

The conductivity type of each transistor may be changed in the above-described first to fourth embodiments.

Figure 12:
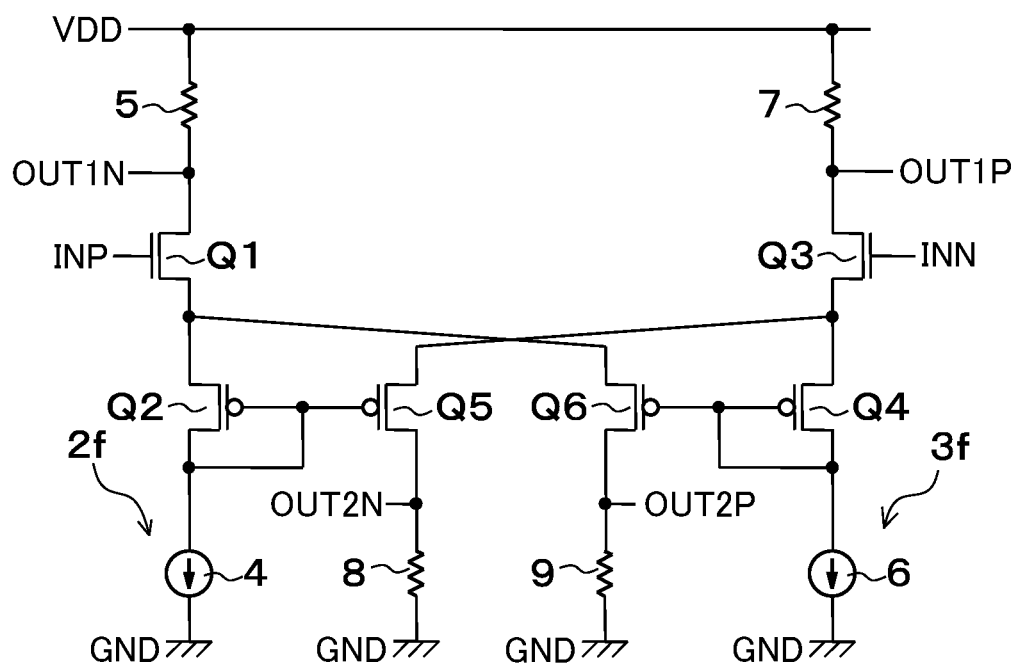
FIG. 12 is a circuit diagram illustrating an example of a circuit according to a fifth embodiment in which conductivity type of each transistor in the differential amplifier circuit shown in FIG. 1 is changed.

In such a case, the positions of the first reference voltage node VDD and the second reference voltage node GND need to be reversed. FIG. 12 is a circuit diagram representing an example of a circuit according to a fifth embodiment in which conductivity type of each transistor in the differential amplifier circuit 1 shown in FIG. 1 is changed. In FIG. 12, the circuit elements that are common to those in FIG. 1 have the same reference numerals.

A differential amplifier circuit 1f shown in FIG. 12 includes a first current circuit 2f connected to a first reference voltage node VDD and a second reference voltage node GND, and a second current circuit 3f connected to the first reference voltage node VDD and the second reference voltage node GND.

The first current circuit 2f includes a first impedance element 5, a first transistor Q1, a second transistor Q2, and a first current source 4, which are connected in series between the first reference voltage node VDD and the second reference voltage node GND. The second current circuit 3f includes a second impedance element 7, a third transistor Q3, a fourth transistor Q4, and a second current source 6 that are connected in series between the first reference voltage node VDD and the second reference voltage node GND.

The first transistor Q1 and the third transistor Q3 are nMOS transistors, and the second transistor Q2 and the fourth transistor Q4 are pMOS transistors. The gate of the second transistor Q2 is connected to the gate of a fifth transistor Q5. The fifth transistor Q5 is cascode-connected to the third transistor Q3. A third impedance element 8 is connected between the drain of the fifth transistor Q5 and the second reference voltage node GND.

The gate of the fourth transistor Q4 is connected to the gate of a sixth transistor Q6. The sixth transistor Q6 is cascode-connected to the first transistor Q1. A fourth impedance element 9 is connected between the drain of the sixth transistor Q6 and the second reference voltage node GND. The fifth transistor Q5 and the sixth transistor Q6 are pMOS transistor.

First differential output signals OUT1P and OUT1N are output from the drains of the first transistor Q1 and the third transistor Q3, and second differential output signals OUT2P and OUT2N are output from the drains of the fifth transistor Q5 and the sixth transistor Q6.

Like the differential amplifier circuit 1f shown in FIG. 12, the conductivity type of each transistor may be changed in the differential amplifier circuits 1a, 1b, 1c, 1d, and 1e shown in FIGS. 4, 7, 9, 10, and 11. Furthermore, only one set of differential output signals (OUT1P, OUT1N) or (OUT2P, OUT2N) may be generated in the differential amplifier circuit 1f shown in FIG. 12.

Sixth Embodiment

The differential amplifier circuits 1, 1a, 1b, 1c, 1d, 1e, and 1f according to the first to fifth embodiments described above may be used in various applications, such as the inside of a high-speed serial transmission circuit.

Figure 13:
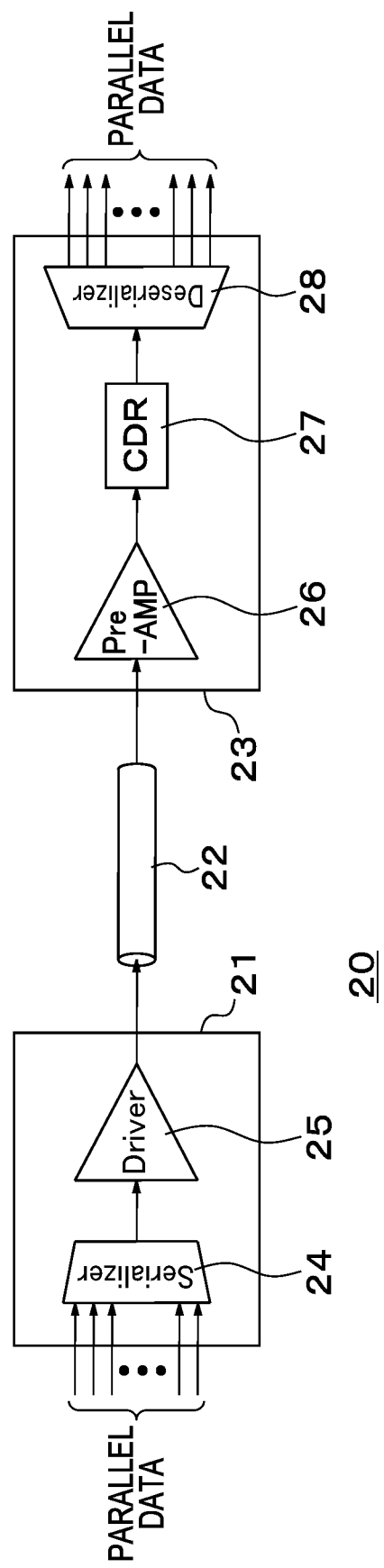
FIG. 13 is a block diagram showing an example of a serial transmission circuit including the differential amplifier circuit according to any of the first to fifth embodiment.

FIG. 13 is a block diagram of an example of a serial transmission circuit 20 including any of the differential amplifier circuits 1, 1a, 1b, 1c, 1d, 1e, and 1f according to the first to fifth embodiments. The serial transmission circuit 20 includes a transmission device 21, a transmission path 22, and a reception device 23. The serial transmission circuit 20 may be implemented on a printed board, for example.

The transmission device 21 includes a serializer 24 and a driver 25. The serializer 24 converts parallel data to serial data in synchronization with clock signals. The driver 25 regulates the waveform and the gain of serial data output from the serializer 24 in order to improve the drive capability. The driver 25 converts the serial data to differential signals. By converting data to differential signals, the tolerance for noise may be improved and the signal amplitude may be suppressed, which leads to a decrease in power consumption.

The transmission path 22 may be a wiring line pattern on the printed board, or a transmission line or a cable on the printed board.

The reception device 23 includes a preamplifier 26, a clock data recovery (CDR) circuit 27, and a deserializer 28. The preamplifier 26 includes a differential amplifier according to any of the first to fifth embodiments. The preamplifier 26 changes the common-mode voltage. The preamplifier 26 outputs one or more sets of differential output signals. The differential output signals output from the preamplifier 26 are input to the clock data recovery circuit 27. The clock data recovery circuit 27 separates the differential output signals into clock signals and serial data, which are supplied to the deserializer 28. The deserializer 28 converts the serial data to parallel data in synchronization with the clock signals.

As described above, any of the differential amplifier circuits 1, 1a, 1b, 1c, 1d, 1e, and 1f according to the first to fifth embodiments may be used in the preamplifier 26 included in the reception device 23 of the serial transmission circuit 20. This decreases the power consumed in the reception device 23 and increases the gain of the reception device 23. As a result, the performance of the serial transmission circuit 20 is improved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A differential amplifier circuit comprising:
  a first circuit comprising a first transistor and a second transistor cascode-connected, and configured to flow a current that depends on a voltage of a first input signal being one of differential input signals, between a drain and a source of the first transistor and between a drain and a source of the second transistor;
  a second circuit comprising a third transistor and a fourth transistor cascode-connected, and configured to flow a current that depends on a voltage of a second input signal being another of the differential input signals, between a drain and a source of the third transistor and between a drain and a source of the fourth transistor;
  a fifth transistor comprising a gate connected to a gate and the drain of the second transistor and cascode-connected to the third transistor, and configured to flow a current that is M times by current flowing between the drain and the source of the second transistor, between a drain and a source of the fifth transistor, where M is a real number that is greater than 0; and
  a sixth transistor comprising a gate connected to a gate and the drain of the fourth transistor and cascode-connected to the first transistor, and configured to flow a current that is N times by current flowing between the drain and the source of the fourth transistor, between a drain and a source of the sixth transistor, where N is a real number that is greater than 0, wherein the source of the first transistor, the source of the second transistor, and the source of the sixth transistor are connected to one another, the source of the third transistor, the source of the fourth transistor, and the source of the fifth transistor are connected to one another, wherein differential output signals are output from at least one of a pair of the drain of the first transistor and the drain of the third transistor and a pair of the drain of the fifth transistor and the drain of the sixth transistor.

2. The differential amplifier circuit according to claim 1, further comprising:
   a pair of first differential output terminals connected to the drain of the first transistor and the drain of the third transistor, and configured to output first differential output signals that vary with a particular voltage amplitude based on a first common-mode voltage; and
   a pair of second differential output terminals connected to the drain of the fifth transistor and the drain of the sixth transistor, and configured to output second differential output signals that vary with the particular voltage amplitude based on a second common-mode voltage of a voltage level that is different from a voltage level of the first common-mode voltage.

3. The differential amplifier circuit according to claim 1, further comprising first differential output terminals connected to the drain of the first transistor and the drain of the third transistor, and configured to output first differential output signals,
   wherein the drain of the fifth transistor and the drain of the sixth transistor are connected to a first reference voltage node,
   the drain of the first transistor is connected to a second reference voltage node via a first impedance element, and
   the drain of the third transistor is connected to the second reference voltage node via a second impedance element.

4. The differential amplifier circuit according to claim 1, further comprising second differential output terminals connected to the drain of the fifth transistor and the drain of the sixth transistor, and configured to output second differential output signals,
   wherein the drain of the fifth transistor is connected to a first reference voltage node via a third impedance element,
   the drain of the sixth transistor is connected to the first reference voltage node via a fourth impedance element, and
   the drain of the first transistor and the drain of the third transistor are connected to a second reference voltage node.

5. The differential amplifier circuit according to claim 1, further comprising:
   a first capacitor connected between the drain of the second transistor and the drain of the sixth transistor; and
   a second capacitor connected between the drain of the fourth transistor and the drain of the fifth transistor.

6. The differential amplifier circuit according to claim 1, further comprising:
   a third capacitor connected between the drain of the first transistor and the drain of the fourth transistor; and
   a fourth capacitor connected between the drain of the third transistor and the drain of the second transistor.

7. The differential amplifier circuit according to claim 1, further comprising:
   a voltage difference detection circuit configured to detect a voltage difference between a particular reference voltage and a voltage that correlates with a drain voltage of the fifth transistor and a drain voltage of the sixth transistor;
   a seventh transistor regulating current flowing between the drain and the source of the second transistor based on the voltage difference; and
   an eighth transistor regulating current flowing between the drain and the source of the fourth transistor based on the voltage difference.

8. A differential amplifier circuit comprising:
   a first circuit comprising a first transistor, and configured to flow a current that depends on a voltage of a first input signal being one of differential input signals, between a drain and a source of the first transistor;
   a second transistor configured to flow a current that correlates with current flowing between the drain and the source of the first transistor, between a drain and a source of the second transistor;
   a second circuit comprising a third transistor and configured to flow a current that depends on a voltage of a second input signal being another of the differential input signals, between a drain and a source of the third transistor;
   a fourth transistor configured to flow a current that correlates with current flowing between the drain and the source of the third transistor, between a drain and a source of the fourth transistor;
   a fifth transistor comprising a gate connected to a gate and the drain of the second transistor, and configured to flow a current that is M times by current flowing between the drain and the source of the second transistor, between the drain and a source of the fifth transistor, where M is a real number greater than 0; and
   a sixth transistor comprising a gate connected to a gate and the drain of the fourth transistor, and configured to flow a current that is N times by current flowing between the drain and the source of the fourth transistor, between the drain and a source of the sixth transistor, where N is a real number greater than 0,
   wherein the source of the first transistor, the source of the second transistor, and the source of the sixth transistor are connected to one another,
   the source of the third transistor, the source of the fourth transistor, and the source of the fifth transistor are connected to one another,
   wherein differential output signals are output from at least one of a pair of the drain of the first transistor and the drain of the third transistor and a pair of the drain of the fifth transistor and the drain of the sixth transistor.

9. The differential amplifier circuit according to claim 8, further comprising:
   a pair of first differential output terminals connected to the drain of the first transistor and the drain of the third transistor, and configured to output first differential output signals that vary with a particular voltage amplitude based on a first common-mode voltage; and
   a pair of second differential output terminals connected to the drain of the fifth transistor and the drain of the sixth transistor, and configured to output second differential output signals that vary with the particular voltage amplitude based on a second common-mode voltage of a voltage level that is different from a voltage level of the first common-mode voltage.

10. The differential amplifier circuit according to claim 8, further comprising first differential output terminals connected to the drain of the first transistor and the drain of the third transistor, and configured to output first differential output signals, wherein the drain of the fifth transistor and the drain of the sixth transistor are connected to a first reference voltage node, the drain of the first transistor is connected to a second reference voltage node via a first impedance element, and the drain of the third transistor is connected to the second reference voltage node via a second impedance element.

11. The differential amplifier circuit according to claim 8, further comprising second differential output terminals connected to the drain of the fifth transistor and the drain of the sixth transistor, and configured to output second differential output signals, wherein the drain of the fifth transistor is connected to a first reference voltage node via a third impedance element, the drain of the sixth transistor is connected to the first reference voltage node via a fourth impedance element, and the drain of the first transistor and the drain of the third transistor are connected to a second reference voltage node.

12. The differential amplifier circuit according to claim 8, further comprising:

a first capacitor connected between the drain of the second transistor and the drain of the sixth transistor; and a second capacitor connected between the drain of the fourth transistor and the drain of the fifth transistor.

13. The differential amplifier circuit according to claim 8, further comprising:

a third capacitor connected between the drain of the first transistor and the drain of the fourth transistor; and a fourth capacitor connected between the drain of the third transistor and the drain of the second transistor.

14. The differential amplifier circuit according to claim 8, further comprising:

a voltage difference detection circuit configured to detect a voltage difference between a particular reference voltage and a voltage that correlates with a drain voltage of the fifth transistor and a drain voltage of the sixth transistor;

a seventh transistor regulating current flowing between the drain and the source of the second transistor based on the voltage difference; and an eighth transistor regulating current flowing between the drain and the source of the fourth transistor based on the voltage difference.

15. A serial transmission circuit comprising:

a transmitter configured to convert parallel data to differentiated serial data and output the serial data;

a transmission path configured to transmit the serial data output from the transmitter; and a receiver configured to receive the serial data transmitted via the transmission path and to convert the serial data to the parallel data, the receiver comprising:

a differential amplifier circuit configured to change an output common-mode voltage of the differential input signals based on the serial data transmitted via the transmission path;

a clock data recovery circuit configured to separate a clock signal from the serial data based on differential output signals output from the differential amplifier circuit; and a parallel converter configured to convert the serial data to the parallel data in synchronization with the clock signal separated at the clock data recovery circuit, and the differential amplifier circuit comprising:

a first circuit comprising a first transistor and a second transistor cascode-connected, and configured to flow a current that depends on a voltage of a first input signal being one of differential input signals, between a drain and a source of the first transistor and between a drain and a source of the second transistor;

a second circuit comprising a third transistor and a fourth transistor cascode-connected, and configured to flow a current that depends on a voltage of a second input signal being another of the differential input signals, between a drain and a source of the third transistor and between a drain and a source of the fourth transistor;

a fifth transistor comprising a gate connected to a gate and the drain of the second transistor and cascode-connected to the third transistor, and configured to flow a current that is M times by current flowing between the drain and the source of the second transistor, between a drain and a source of the fifth transistor, where M is a real number that is greater than 0; and a sixth transistor comprising a gate connected to a gate and the drain of the fourth transistor and cascode-connected to the first transistor, and configured to flow a current that is N times by current flowing between the drain and the source of the fourth transistor, between a drain and a source of the sixth transistor, where N is a real number that is greater than 0, wherein the source of the first transistor, the source of the second transistor, and the source of the sixth transistor are connected to one another, the source of the third transistor, the source of the fourth transistor, and the source of the fifth transistor are connected to one another, wherein differential output signals are output from at least one of a pair of the drain of the first transistor and the drain of the third transistor and a pair of the drain of the fifth transistor and the drain of the sixth transistor.

16. The serial transmission circuit according to claim 15, wherein the differential amplifier circuit further comprises first differential output terminals connected to the drain of the first transistor and the drain of the third transistor, and configured to output first differential output signals, wherein the drain of the fifth transistor and the drain of the sixth transistor are connected to a first reference voltage node, the drain of the first transistor is connected to a second reference voltage node via a first impedance element, and the drain of the third transistor is connected to the second reference voltage node via a second impedance element.

17. The serial transmission circuit according to claim 15, wherein the differential amplifier circuit further comprises second differential output terminals connected to the drain of the fifth transistor and the drain of the sixth transistor, and configured to output second differential output signals,
   wherein the drain of the fifth transistor is connected to a first reference voltage node via a third impedance element,
   the drain of the sixth transistor is connected to the first reference voltage node via a fourth impedance element, and
   the drain of the first transistor and the drain of the third transistor are connected to a second reference voltage node.

18. A serial transmission circuit comprising:
a transmitter configured to convert parallel data to differentiated serial data and output the serial data;
a transmission path configured to transmit the serial data output from the transmitter; and
a receiver configured to receive the serial data transmitted via the transmission path and to convert the serial data to the parallel data,
the receiver comprising:
   a differential amplifier circuit configured to change an output common-mode voltage of the differential input signals based on the serial data transmitted via the transmission path;
   a clock data recovery circuit configured to separate a clock signal from the serial data based on differential output signals output from the differential amplifier circuit; and
   a parallel converter configured to convert the serial data to the parallel data in synchronization with the clock signal separated at the clock data recovery circuit, and
the differential amplifier circuit comprising:
   a first circuit comprising a first transistor, and configured to flow a current that depends on a voltage of a first input signal being one of differential input signals, between a drain and a source of the first transistor;
   a second transistor configured to flow a current that correlates with current flowing between the drain and the source of the first transistor, between a drain and a source of the second transistor;
   a second circuit comprising a third transistor and configured to flow a current that depends on a voltage of a second input signal being another of the differential input signals, between a drain and a source of the third transistor;
   a fourth transistor configured to flow a current that correlates with current flowing between the drain and the source of the third transistor, between a drain and a source of the fourth transistor;
   a fifth transistor comprising a gate connected to a gate and the drain of the second transistor, and configured to flow a current that is M times by current flowing between the drain and the source of the second transistor, between the drain and a source of the fifth transistor, where M is a real number greater than 0; and
   a sixth transistor comprising a gate connected to a gate and the drain of the fourth transistor, and configured to flow a current that is N times by current flowing between the drain and the source of the fourth transistor, between the drain and a source of the sixth transistor, where N is a real number greater than 0,
   wherein the source of the first transistor, the source of the second transistor, and the source of the sixth transistor are connected to one another,
   the source of the third transistor, the source of the fourth transistor, and the source of the fifth transistor are connected to one another,
   wherein differential output signals are output from at least one of a pair of the drain of the first transistor and the drain of the third transistor and a pair of the drain of the fifth transistor and the drain of the sixth transistor.

19. The serial transmission circuit according to claim 18, wherein the differential amplifier circuit further comprises first differential output terminals connected to the drain of the first transistor and the drain of the third transistor, and configured to output first differential output signals,
   wherein the drain of the fifth transistor and the drain of the sixth transistor are connected to a first reference voltage node,
   the drain of the first transistor is connected to a second reference voltage node via a first impedance element, and
   the drain of the third transistor is connected to the second reference voltage node via a second impedance element.

20. The serial transmission circuit according to claim 18, wherein the differential amplifier circuit further comprises second differential output terminals connected to the drain of the fifth transistor and the drain of the sixth transistor, and configured to output second differential output signals,
   wherein the drain of the fifth transistor is connected to a first reference voltage node via a third impedance element,
   the drain of the sixth transistor is connected to the first reference voltage node via a fourth impedance element, and
   the drain of the first transistor and the drain of the third transistor are connected to a second reference voltage node.

* * * * *